(12) United States Patent
Linder

(10) Patent No.: US 6,762,080 B2
(45) Date of Patent: Jul. 13, 2004

(54) METHOD OF MANUFACTURING A SEMICONDUCTOR DEVICE HAVING A CATHODE AND AN ANODE FROM A WAFER

(75) Inventor: Stefan Linder, Zofingen (CH)

(73) Assignee: ABB Schweiz Holding AG, Baden (CH)

( * ) Notice: Subject to any disclaimer, the term of this patent is extended or adjusted under 35 U.S.C. 154(b) by 0 days.

(21) Appl. No.: 10/224,495

(22) Filed: Aug. 21, 2002

(65) Prior Publication Data

US 2002/0195658 A1 Dec. 26, 2002

Related U.S. Application Data

(62) Division of application No. 09/473,950, filed on Dec. 29, 1999, now abandoned.

(30) Foreign Application Priority Data

Dec. 29, 1998 (DE) .......................................... 198 60 581

(51) Int. Cl.[7] ...................... H01L 21/332; H01L 21/336
(52) U.S. Cl. ...................... 438/133; 438/135; 438/136; 438/137; 438/138; 438/139; 438/197; 438/206; 438/212; 438/268; 438/272; 438/273

(58) Field of Search .......................... 438/133, 135–139, 438/197, 206, 212, 268, 272, 273, 459, 514, 565

(56) References Cited

U.S. PATENT DOCUMENTS

5,506,153 A * 4/1996 Brunner et al. ................. 437/6

OTHER PUBLICATIONS

S. wolf et al., Silicon Processing for the VLSI Era, vol. 1, pp242 & 280–281.*

* cited by examiner

Primary Examiner—Donghee Kang
(74) Attorney, Agent, or Firm—Oblon, Spivak, McClelland, Maier & Neustadt, P.C.

(57) ABSTRACT

In a method of manufacturing a semiconductor element (6) having a cathode (3) and an anode (5), the starting material used is a relatively thick wafer (1) to which, as a first step, a barrier region (21) is added on the anode side. It is then treated on the cathode side, and the thickness of the wafer (1) is then reduced on the side opposite to the cathode (3), and an anode (5) is produced on this side in a further step. The result is a relatively thin semiconductor element which can be produced economically and without epitaxial layers.

15 Claims, 2 Drawing Sheets

METHOD OF MANUFACTURING A SEMICONDUCTOR DEVICE HAVING A CATHODE AND AN ANODE FROM A WAFER

BACKGROUND OF THE INVENTION

1. Field of the Invention

The invention relates to the field of power electronics. It relates to a method of manufacturing a semiconductor element having a cathode and an anode from a wafer.

2. Description of the Related Art

To achieve the best possible electrical characteristics for semiconductor power switches, such as an IGBT (Insulated Gate Bipolar Transistor), the thickness of the active zone of a semiconductor element must be selected to be as close as possible to the physical material boundaries.

By way of example, the thickness has a direct effect on on-state losses. In the case of breakdown voltages of 600–1800 V, semiconductor element thicknesses of 60–250 $\mu$m are therefore desirable. However, such small thicknesses are a big problem in the production of semiconductor elements, because wafers having a diameter of 100 mm and more should have a thickness of at least 300 $\mu$m in order to minimize the risk of breakage during manufacture.

Up to now, this problem has been solved by the so-called epitaxial technique. This involves growing an electrically active region on a mounting substrate having a relatively large thickness of 400–600 $\mu$m. The mounting substrate then firstly ensures the necessary robustness for the semiconductor element produced, and secondly the substrate forms the anode of the semiconductor element.

Generally, there is a barrier layer, also called the buffer, arranged between the mounting substrate and the electrically active region. In the off-state case, the barrier layer serves to decelerate the electric field abruptly before the anode and thus to keep it away from the latter, because, if the electric field were to reach the anode, the semiconductor element would be destroyed. Growing the active region is a lengthy and complicated process, so that this epitaxial technique is relatively expensive. Furthermore, this technique has the disadvantage that it is not possible to dope the mounting substrate, that is to say the anode, sufficiently weakly. This would be an advantage, however, because the anode of a power semiconductor element should be doped as weakly as possible in order for it to obtain ideal electrical properties. Weak doping means high resistivity, however, which, with the relatively large thickness of the mounting substrate, would result in a not negligible resistance value.

A relatively new method of manufacturing a semiconductor element has therefore come to light which requires no epitaxial layers. Such methods are known, for example, from Darryl Burns et al., NPT-IGBT-Optimizing for manufacturability, IEEE, pages 109–112, 0-7803-3106-0/1996; Andreas Karl, IGBT Modules Reach New Levels of Efficiency, PCIM Europe, Issue 1/1998, pages 8–12 and J. Yamashita et al., A novel effective switching loss estimation of non-punchthrough and punchthrough IGBTs, IEEE, pages 331–334, 0-7803-3993-2/1997. Semiconductor elements manufactured using this method are called NPT (non-punchthrough), in contrast to the punchthrough semiconductor elements based on the epitaxial method.

In this method, a relatively thick wafer without any epitaxial layer is used as the starting material. Typical thicknesses are 400–600 $\mu$m. In a first step, the wafer is treated on the cathode side, that is to say photolithography, ion implantation, diffusion, etching and other processes necessary for the manufacture of the semiconductor element are carried out. In a second step, the wafer is reduced to its desired thickness on the side opposite to the cathode. This is done using customary techniques, generally by grinding and etching. In a third step, an anode is then diffused in on this reduced side.

Although this method is distinguished from the epitaxial method by its lower costs, it nevertheless also has a plurality of disadvantages:

Diffusion of the anode is relatively difficult because, in this method step, the wafer is already very thin and can thus break easily. In addition, the element must no longer be heated intensely, because, in the first method step, metal layers which melt at temperatures above 500° C. have already been applied on the cathode side. This means that the anode can be doped only weakly. This could, admittedly, have a positive effect on the electrical properties of the semiconductor element. However, as it is not possible to incorporate a sufficiently high doping quantity, which could be used as a buffer, the semiconductor element must be thick enough to ensure that avalanche breakdown occurs in off-state mode before the electric field reaches the anode. In principle, semiconductor elements manufactured in this manner are therefore thicker than elements manufactured using the epitaxial technique. This means that the advantage of the weakly doped anode is at least partially cancelled out by the aforementioned disadvantages of too thick an active region.

EP-A-0,700,095 additionally discloses a turn-off thyristor suitable for high off-state voltages. This thyristor comprises a semiconductor element having an anode and a cathode, the anode having a transparent emitter. Such anode emitters are already known for low-power components such as solar cells, diodes or transistors. A transparent anode emitter is understood as being an anode-side emitter with comparatively weak injection, so that high proportions of the electron current coming from the cathode can be extracted without recombination and thus without releasing an injected hole. In front of this transparent anode emitter, there is a barrier layer which, firstly, reduces the electric field in off-state mode, but, secondly, can also be used to influence the injection efficiency of the transparent anode. In this case, the barrier layer is either diffused in or is produced epitaxially, the doping profile in the first case having a Gaussian distribution and, in the second case, having a distribution which is homogeneous or step-like over the layer thickness. Although this semiconductor element exhibits positive behavior in the operating state, it can similarly not be manufactured with any desired thickness on account of the risk of breakage.

SUMMARY OF THE INVENTION

It is therefore the object of the invention to create a semiconductor element which is as thin as possible and can be manufactured economically.

This object is achieved is achieved by a method of manufacturing including the steps of a) doping the wafer from the side opposite to the cathode producing a doping profile, b) treating the wafer on the cathode side, c) reducing the thickness of the wafer on the side opposite to the cathode to such an extent that the doping profile is removed except for a weakly doped end region of the doping profile, the weakly doped end region forming a barrier region, and d) producing an anode on the side of the wafer on which the thickness was reduced.

The method according to the invention combines the advantages of a semiconductor element manufactured using the epitaxial technique and of a semiconductor element manufactured using the NPT technique, the result being a semiconductor element whose electrical properties are clearly distinguished from those of the semiconductor elements manufactured using these two known methods.

According to the invention, the procedure is as in the NPT technique without epitaxial layers, a barrier region being added before the starting material is treated on the cathode side. The barrier region is added by doping from a side of the wafer which is opposite to the future cathode, and this produces a doping profile whose density increases toward the future anode and which has a cut off doping profile. After the processing on the cathode side, the wafer is thinned to such an extent that the doping profile is removed down to a weakly doped end region which essentially forms the barrier region. A weakly doped anode, preferably having a transparent anode emitter, can then be manufactured which is protected, in off-state mode, against the electric field by the adjacent, preferably adjoining, barrier region.

A further advantage is that the semiconductor element 6 according to the invention has a positive temperature coefficient for the voltage drop in on-state mode, unlike the elements in the epitaxial technique.

The method according to the invention can be used to manufacture the widest variety of semiconductor elements, particularly for IGBTs (Insulated Gate Bipolar Transistor), GTOs (Gate turn-off Thyristor) or conventional thyristors.

Other advantageous embodiments can be found in the dependent patent claims.

BRIEF DESCRIPTION OF THE DRAWINGS

The method according to the invention and the subject-matter of the invention are explained in more detail below with the aid of a preferred illustrative embodiment which is shown in the appended drawings, in which.

DETAILED DESCRIPTION OF THE PREFERRED EMBODIMENTS

Figure 1A:
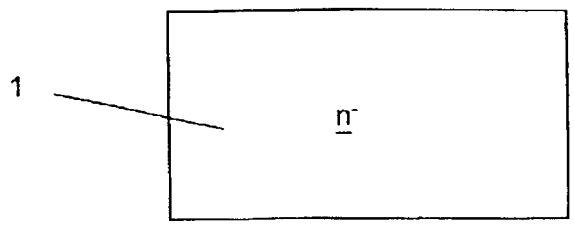
FIGS. 1a–1e show the manufacture of a semiconductor element according to the invention from the starting material to the end product.

As shown in FIGS. 1a to 1e, the semiconductor element according to the invention is manufactured from an integral, preferably uniformly n⁻-doped wafer 1 (FIG. 1a). In its starting material form, the wafer 1 is relatively thick, the thickness being proportioned such that it minimizes the risk of breakage when the wafer 1 is handled. Typical values are 400–600 μm.

In a first method step, the wafer 1 is n⁺-doped starting from one side, using known techniques such as ion implantation with subsequent diffusion, deposition with subsequent diffusion or diffusion from the vapor phase. As shown by arrows in FIG. 1b, doping is carried out on one side. However, it is also possible to dope the wafer on two sides, in which case the wafer is subsequently reduced on one side. In the wafer 1, the result is a diffusion region 2 having a doping profile 20 which increases on the source side (FIG. 2), merging from a weakly n-doped region into a highly doped n⁺ region. The shape of the doping profile depends on the manufacturing technique; in general, it is of Gaussian shape or corresponds to a complementary error function.

Figure 1B:
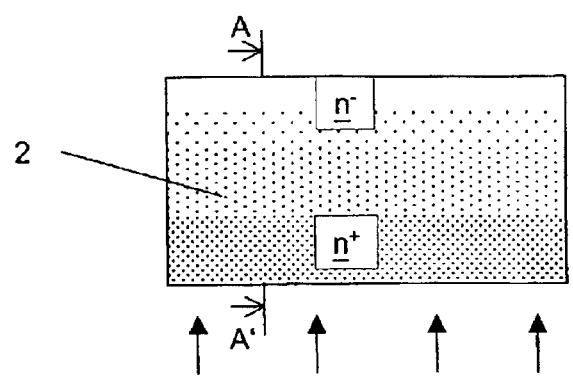

The penetration depth is relatively high, and preferably reaches over at least half the thickness of the wafer 1, but not through to the opposite side. In FIG. 1b, the doping is shown in dots, the density of the dots being a schematic indication of the doping density. However, in contrast to the illustration shown in FIG. 1b, the doping profile is preferably stepless.

The choice of penetration depth and of the gradient of the doping profile 20 can be used to predefine the thickness of the resulting semiconductor element, as explained later. Diffusion generally takes place at a relatively high temperature, preferably at above 1200° C. The high penetration depth necessitates a relatively long diffusion time, generally over a plurality of days.

Figure 1C:
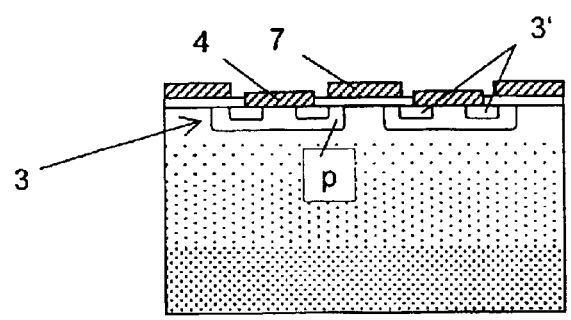
Figure 1D:
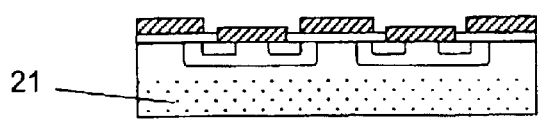

In a subsequent step, the undiffused side of the wafer 1 is treated, with a cathode structure 3 having an n⁺-doped cathode 3', a cathode metal coating 4 and, preferably, a control electrode 7 being applied or introduced using known processes. These processes are equivalent to those described for the NPT technique and are therefore not described in any great detail again here. These processes differ according to the type of semiconductor element to be manufactured, in the same way as the structures of the active region 3 which are produced by them also differ. The result of such treatment on the cathode side, which is shown in FIG. 1c, is therefore merely one example of many possibilities.

In a subsequent step, the thickness of the wafer 1 is reduced on the side opposite to the cathode metal coating 4, preferably by grinding and etching, as carried out in the NPT technique. Preferably, the entire diffusion region 2 is removed down to a weakly n-doped end region which at least approximately forms a barrier region 21.

In a final step (FIG. 1e), an anode having a transparent anode emitter is added to the reduced side of the wafer 1 by appropriately doping a border region. This border region is narrow in comparison to the thickness of the resulting semiconductor element. The anode emitter, which forms the entire anode in the case shown here, is p⁺-doped in this case, the area occupied by p-doping atoms at the anode being less than $2\times10^{14}$ cm⁻², preferably less than $1\times10^{13}$ cm⁻². Depending on the type of semiconductor element, the anode has various kinds of structures. A second metal layer, the anode metal coating 6, can then be added to this side for contact-making purposes. Finally, the anode efficiency is preferably reduced by irradiating the anode 5 and that part of the barrier layer 21 adjoining the anode 5 with high-energy ions.

Figure 1E:
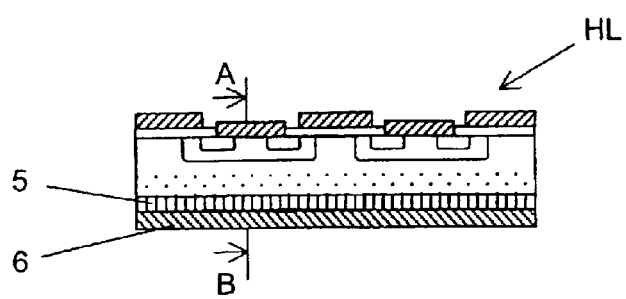

As FIG. 1e shows, the result is a semiconductor element HL having a cathode structure 3 with an associated cathode metal coating 4 and control electrode 7, an anode 5 with an associated anode metal coating 6, and a barrier region 21 which is next to the anode 5, preferably adjoining it, and which has a doping profile which is cut off toward the anode 5. The semiconductor element HL according to the invention has a relatively low thickness, typically 80–180 μm, however, the thickness depending on the voltage class of the semiconductor element.

Figure 2:
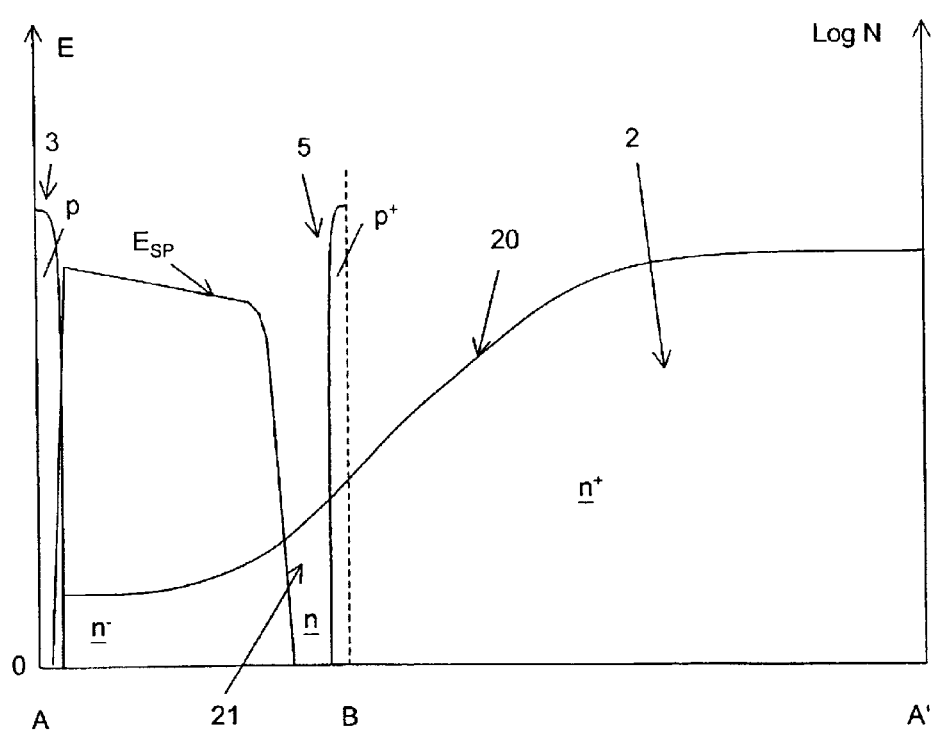
FIG. 2 shows a graphical illustration of a diffusion profile and of the electric field in off-state mode along the section A—A' shown in FIG. 1b and the section A–B shown in FIG. 1e.

FIG. 2 shows the full profile of the essential dopings of the semiconductor element HL according to the invention: the section from A to A' on the ordinate shows the original thickness of the wafer 1, and the section from A to B shows the thickness of the finished semiconductor element HL. The abscissa, firstly, shows the electric field, and, secondly, it is logarithmic and shows the number of doping atoms per cm³.

As FIG. 2 shows, in the first method step, the n⁻-doped starting material is removed toward the implanted or doped side by n- or n⁺-doping, with the density increasing toward the doped side. When the wafer thickness is reduced, the remaining doped end region, that is to say the barrier region 21, is proportioned such that, in the semiconductor element's off-state mode, avalanche breakdown occurs before the electric field has reached the anode 5. In order to optimize the effectiveness of the emitter, the doping of the barrier region is chosen to be so high that a peak doping of at least $5 \times 10^{14}$ cm$^{-3}$, preferably $1 \times 10^{15}$ cm$^{-3}$, and at most $6 \times 10^{16}$ cm$^{-3}$, preferably $1 \times 10^{16}$ cm$^{-3}$, is achieved at the anode. In this example, this is the case before the position=point B–thickness of the anode 5, where point B represents the thickness of the finished semiconductor element as shown in FIG. 1e.

FIG. 2 also shows the electric field in off-state mode.

The method according to the invention thus allows thin power semiconductor elements having a transparent anode and an integrated barrier layer to be manufactured.

| List of reference symbols | |
|---|---|
| 1 | Wafer |
| 2 | Diffusion region |
| 20 | Doping profile |
| 21 | Barrier region |
| 3 | Cathode structure |
| 3' | Cathode |
| 4 | Cathode metal coating |
| 5 | Anode |
| 6 | Anode metal coating |
| 7 | Control electrode |
| HL | Semiconductor element |
| E$_{SP}$ | Electric field in off-state mode |

What is claimed is:

1. A method of manufacturing a semiconductor element having a cathode and an anode from a wafer, comprising the steps of:
    a) doping the wafer from the side opposite to the cathode, the doping density of the doped region producing a doping profile,
    b) treating the wafer on the cathode side,
    c) reducing the thickness of the wafer on the side opposite to the cathode to such an extent that the doped region is removed except for a weakly doped end region identifiable by the doping profile, said weakly doped end region forming a barrier region, and
    d) producing an anode on the side of the wafer on which the thickness was reduced.

2. The method as claimed in claim 1, wherein the thickness of the wafer is reduced in step c) such that at least part of the barrier region is retained.

3. The method as claimed in claim 1, wherein the weakly doped end region is proportioned such that, when the voltage increases in the off-state of the semiconductor element, breakdown occurs before the electric field has reached the anode.

4. The method as claimed in claim 1, wherein diffusion is required for adding the barrier region and said diffusion takes place at a temperature of at least 1200° C.

5. The method as claimed in claim 1, wherein the barrier region having a peak doping at the anode of at least $5 \times 10^{14}$ cm$^{-3}$, preferably $1 \times 10^{15}$ cm$^{-3}$, and at most $6 \times 10^{16}$ cm$^{-3}$, preferably $1 \times 10^{16}$ cm$^{-3}$, is added.

6. The method as claimed in claim 1, wherein the barrier region is added by doping from a side of the wafer which is opposite to the cathode, whereby a doping profile is produced.

7. The method as claimed in claim 6, wherein the barrier region is produced by n$^+$-doping the wafer by means of ion implantation with subsequent diffusion.

8. The method as claimed in claim 6, wherein the barrier region is produced by n$^+$-doping the wafer by means of deposition with subsequent diffusion.

9. The method as claimed in claim 6, wherein the barrier region is produced by n$^+$-doping the wafer by means of diffusion from a vapor phase.

10. The method as claimed in claim 1, wherein the weakly doped end region is proportioned such that, when the voltage increases in the off-state of the semiconductor element, breakdown occurs before the electric field has reached the anode.

11. The method as claimed in claim 10, wherein the doping of the barrier region is selected such that a peak doping of at least $5 \times 10^{14}$ cm$^{-3}$, and at most $6 \times 10^{16}$ cm$^{-3}$ is achieved at the anode.

12. The method as claimed in claim 10 wherein the doping of the barrier region is selected such that a peak doping of at least $1 \times 10^{15}$ cm$^{-3}$ and at most $1 \times 10^{15}$ cm$^{-3}$ is achieved at the anode.

13. The method as claimed in claim 1, wherein the barrier region is produced by n$^+$-doping the wafer by means of ion implantation with subsequent diffusion.

14. The method as claimed in claim 1, wherein the barrier region is produced by n$^+$-doping the wafer by means of deposition with subsequent diffusion.

15. The method as claimed in claim 1, wherein the barrier region is produced by n$^+$-doping the wafer by means of diffusion from a vapor phase.

* * * * *